(12) United States Patent
Yeo et al.

(10) Patent No.: US 6,426,743 B1
(45) Date of Patent: Jul. 30, 2002

(54) SHIFT REGISTER

(75) Inventors: Ju Cheon Yeo, Anyang-shi; Sang Young Yoon, Kyungki-do; Jin Sang Kim, Anyang-shi, all of (KR)

(73) Assignee: LG. Philips LCD Co., LTD, Seoul (KR)

( * ) Notice: Subject to any disclaimer, the term of this patent is extended or adjusted under 35 U.S.C. 154(b) by 0 days.

(21) Appl. No.: 09/500,914

(22) Filed: Feb. 9, 2000

(30) Foreign Application Priority Data

Feb. 9, 1999 (KR) .......................................... P99-4372

(51) Int. Cl.$^7$ ................................................. G09G 5/00
(52) U.S. Cl. .......................... 345/213; 345/100; 345/99
(58) Field of Search ............................. 345/94, 98, 99, 345/100, 87, 213, 211, 204

(56) References Cited

U.S. PATENT DOCUMENTS

| | | | |
|---|---|---|---|
| 4,623,908 A | 11/1986 | Oshima et al. ............... | 357/23 |
| 5,222,082 A | * 6/1993 | Plus ............................. | 377/79 |
| 5,410,583 A | * 4/1995 | Weisbrod et al. ............. | 377/75 |
| 5,434,899 A | 7/1995 | Huq et al. .................... | 377/78 |
| 5,517,543 A | 5/1996 | Schleupen et al. ............ | 377/79 |
| 5,648,790 A | 7/1997 | Lee .............................. | 345/58 |
| 6,067,067 A | 5/2000 | Park ............................ | 345/100 |
| 6,300,928 B1 | * 10/2001 | Kim ............................. | 345/92 |

FOREIGN PATENT DOCUMENTS

| | | |
|---|---|---|
| EP | 615250 | 9/1994 |
| EP | 801376 | 10/1997 |

OTHER PUBLICATIONS

Search Report dated Dec. 21, 1999.
Preliminary Search Report dated Apr. 3, 2001.

* cited by examiner

Primary Examiner—Kent Chang
Assistant Examiner—Tom V. Sheng
(74) Attorney, Agent, or Firm—Long Aldridge & Norman LLP

(57) ABSTRACT

In a shift register for driving a pixel row in a liquid crystal display device a plurality of stages are connected: to a high level voltage source, a low level voltage source and a phase-delayed clock signal generator; to row lines; and in cascade, with respect to a scanning signal, for charging and discharging the row lines. Each stage of the shift register has a pull-up transistor, a pull-down transistor, and first to fourth transistors. The pull-up transistor has a control electrode and a conduction path connected between the first clock signal line and the output terminal. The pull-down transistor has a control electrode and a conduction path connected between the low level voltage line and the output terminal. The first and second transistors have conduction paths connected in series between the input terminal and the control electrode of the pull-up transistor, and each has a control electrode connected commonly to the second clock signal line. The first and second transistors allow a voltage to be charged on the control electrode of the pull-up transistor. The third and fourth transistors have conduction paths connected in series between the third clock signal line and the control electrode of the pull-down transistor, and each has a control electrode connected commonly to the third clock signal line. The third and fourth transistors allow a voltage to be charged on the control electrode of the pull-down transistor.

13 Claims, 10 Drawing Sheets

SHIFT REGISTER

CROSS REFERENCE TO RELATED APPLICATIONS

This application claims the benefit of priority of Korean Patent Application No. P994372 filed on Feb. 9, 1999, which application is hereby incorporated by reference for all purposes as if fully set forth herein.

BACKGROUND OF THE INVENTION

1. Field of the Invention

This invention relates to a circuit for driving an active matrix type display device of, and more particularly to a shift register for driving pixel rows in a liquid crystal display.

2. Discussion of the Related Art

Generally, a conventional liquid crystal display device used in a television or a computer includes a liquid crystal matrix having liquid crystal cells arranged at intersections of data lines with select or gate lines. The select lines are horizontal lines (i.e., row lines) of the liquid crystal matrix, which are sequentially driven with a shift register.

FIG. 1 is a block diagram showing schematically the configuration of a conventional 4-phase shift register. The shift register of FIG. 1 includes n stages $12_1$ to $12_n$ which are cascade-connected to each other and connected respectively to n row lines ROW1 to ROWn through output lines $14_1$ to $14_n$. In the shift register, a start pulse SP is input to the first stage $12_1$. The second to nth stages $12_2$ to $12_n$ each respond to an output signal $g_i$ to $g_{n-1}$ of a previous stage $12_1$ to $12_{n-1}$ and two of four clock signals C1 to C4 select the row line ROWi connected to the pixel row. Each of the stages $12_1$ to $12_n$ has the same circuit configuration and shifts the start pulse toward a respective output line $14_i$ every period of the horizontal synchronous signal.

Referring to FIG. 2, there is illustrated a circuit configuration of an arbitrary stage $12_i$ shown in FIG. 1. The stage $12_i$ includes a fifth NMOS transistor T5 for applying a high logic voltage signal to the output line $14_i$ and a sixth NMOS transistor T6 for supplying a low logic voltage signal to the output line $14_i$.

If an output signal $g_{i-1}$ of a previous stage, which is used as the start pulse, goes to a high logic level in the interval t1 as shown in FIG. 3, first and fourth NMOS transistors T1 and T4 are turned-on. Then, a voltage signal VP1 is charged on a first node P1 while a voltage signal VP2 on a second node P2 is discharged. Therefore, the fifth NMOS transistor T5 is turned-on by the voltage VP1 on the first node P1. At this time, since a first clock signal C1 applied to the fifth NMOS transistor T5 has a low logic level, there is developed an output signal Vout having the low logic level on the output line $14_i$. In the interval t2, when the output signal $g_{i-1}$ of the previous stage is inverted to a low logic level and the first clock signal C1 has a high logic level, the first NMOS transistor T1 is turned-off and the voltage signal VP1 on the first node P1 is bootstrapped by coupling with a parasitic capacitor Cgs between the gate and source electrodes of the fifth NMOS transistor T5. To this end, the first clock signal C1 having a high logic level is applied to the output line $14_i$ without a leakage. Next, if the first clock signal C1 changes to a low logic level in the interval t3, the output signal Vout on the output line $14_i$ changes to a low logic level because the fifth NMOS transistor T5 maintains the turned-on state. Finally, in the interval t4 when a third clock signal C3 having a high logic level is applied to a third NMOS transistor T3, the third NMOS transistor T3 is turned-on to charge a high level voltage VDD on the second node P2, thereby developing a high logic level on the second node P2. The voltage signal VP2 charged on the second node P2 allows the sixth NMOS transistor T6 to be turned-on such that the voltage charged on the output line $14_i$ is discharged to a ground voltage source VSS through the sixth NMOS transistor T6. Also, the voltage signal VP2 charged on the second node P2 enables the second NMOS transistor T2 to be turned-on, thereby discharging the voltage signal VP1 charged on the first node P1 toward the ground voltage source VSS through the second NMOS transistor T2.

In FIG. 2, the voltage signal VP1 on the first node P1 is bootstrapped to a very high level in the interval t2 causing the bootstrapping operation. However, if the absolute threshold voltage |Vth| of the first and second NMOS transistors T1 and T2 is low, the voltage signal VP1 on the first node P1 is discharged as shown in FIG. 4. This results from a current signal on the first node P1 leaking through each of the first and second NMOS transistors T1 and T2.

FIG. 4 shows results of a simulation for the prior shift register circuit including transistors for which the absolute threshold voltage |Vth| is low. Also, FIG. 4 shows the waveforms of an output signal Vout of the present stage $12_i$, and the voltage signals VP1 and VP2 on the first and second nodes P1 and P2. Referring to FIG. 4, the voltage signal VP1 on the first node P1 is distorted by a current signal leaked through each of the first and second NMOS transistors T1 and T2. Due to this, the output signal Vout charged on the output line $14_i$ is also distorted. As a result, it provides a disadvantage in that a next stage malfunctions. Also, the voltage signal VP2 on the second node P2 is unstable because of a current signal leaked by the third and fourth NMOS transistors T3 and T4, as shown in FIG. 4. Due to this, the second and sixth NMOS transistors T2 and T6 also malfunction. Further, since the drain and gate electrodes of the first NMOS transistor T1 are connected to each other, the output signal $g_{i-1}$ of the previous stage is dropped down by the threshold voltage Vth of the first NMOS transistor T1 before being applied to the first node P1. The output signal $g_{i-1}$ of the previous stage drops down more in the case that it is defective in the liquid crystal panel. In this case, the output signal $g_{i-1}$ of the previous stage drops down more and more with each succeeding stage until the last stage. As a result, the shift register circuit does not operate.

SUMMARY OF THE INVENTION

Accordingly, it is an object of the present invention to provide a shift register that is capable of increasing the range of operating voltage as well as preventing a malfunction.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve these and other objects of the invention, a shift register according to one aspect includes a plurality of stages which are commonly connected to a high level voltage source, a low level voltage source and a phase-delayed clock signal generator; which are connected to row lines; and which are connected, in cascade, with respect to a scanning signal, for charging and discharging the row lines.

Each of the plurality of stages included in the shift register according to another aspect comprises: a pull-up transistor having a control electrode and a conduction path connected between the first clock signal line and the output terminal; a pull-down transistor having a control electrode and a conduction path connected between the low level voltage line and the output terminal; first and second transistors having conduction paths connected in series between the input terminal and the control electrode of the pull-up transistor, and each having a control electrode, connected commonly to the second clock signal line, the first and second transistors allowing a voltage to be charged on the control electrode of the pull-up transistor; and third and fourth transistors having conduction paths connected in series between the third clock signal line and the control electrode of the pull-down transistor, and each having a control electrode, connected commonly to the third clock signal line, the third and fourth transistors allowing a voltage to be charged on the control electrode of the pull-down transistor.

Each of the plurality of stages included in the shift register according to still another aspect comprises: a pull-up transistor having a control electrode and conduction path connected between the first clock signal line and the output terminal; a pull-down transistor having a control electrode and a conduction path connected between the low level voltage line and the output terminal; first and second transistors having conduction paths connected in series between the input terminal and, the control electrode of the pull-up transistor and, each having a control electrode connected, respectively, to the input terminal and the second clock signal line, the first and second transistors allowing a voltage to be charged on the control electrode of the pull-up transistor; and third and fourth transistors having conduction paths connected in series between the third clock signal line and the control electrode of the pull-down transistor, and each having a control electrode, connected commonly to the third clock signal line, the third and fourth transistors allowing a voltage to be charged on the control electrode of the pull-down transistor.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of embodiments of the present invention with reference to the accompanying drawings, in which.

DETAILED DESCRIPTION OF THE PREFERRED EMBODIMENT

Figure 5:
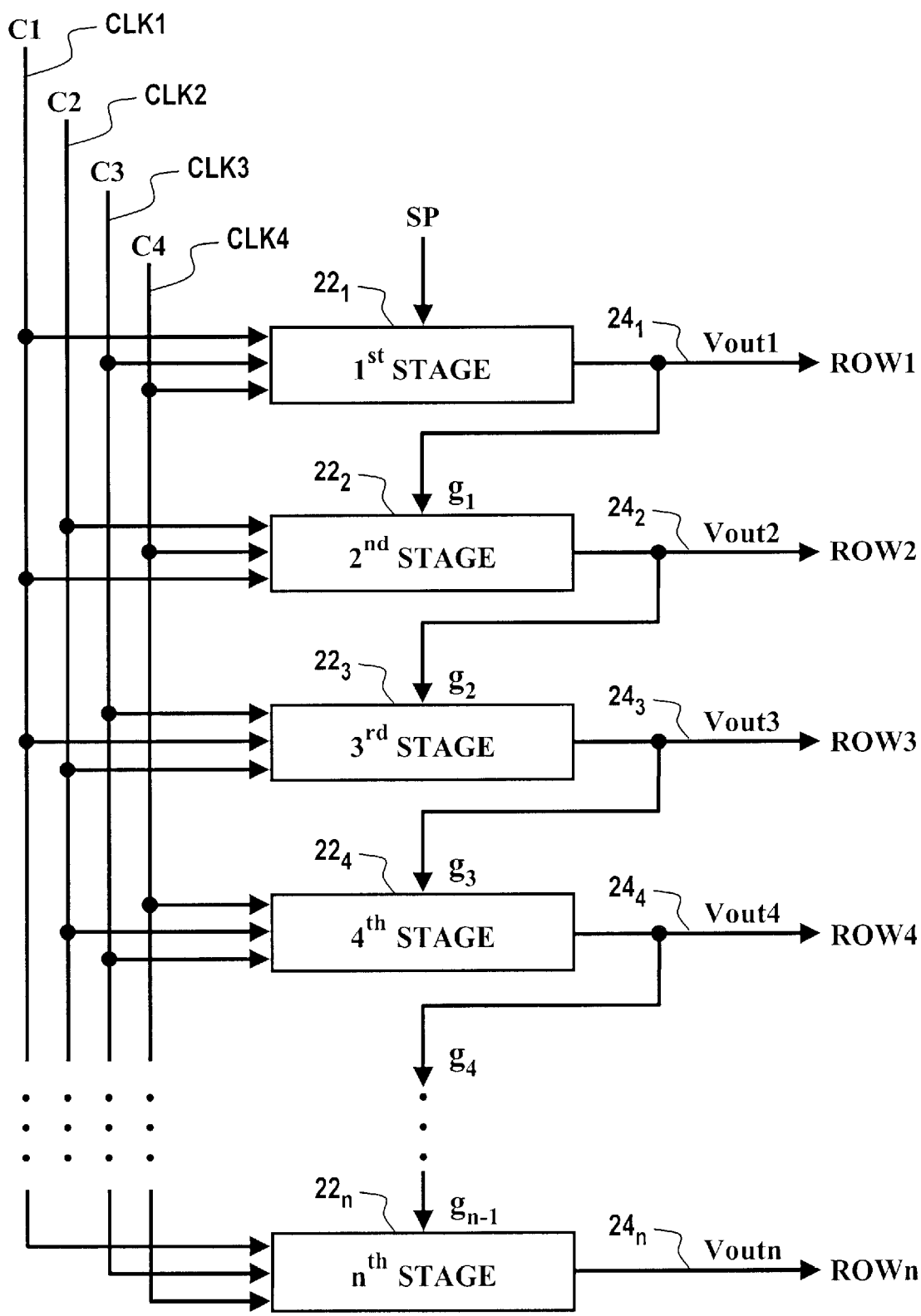
FIG. 5 is a block diagram showing schematically a configuration of a 4-phase shift register according to an embodiment of the present invention.

FIG. 5 illustrates a shift register according to an embodiment of the present invention. The shift register of FIG. 5 includes n stages $22_1$ to $22_n$ cascade-connected to a start pulse input line. The n stages $22_1$ to $22_n$ each are connected to 3 clock signal lines among 4 phase clock signal lines CLK1 to CLK4. Each output line $24_1$ to $24_n$ of the n stages $22_1$ to $22_n$ shown in FIG. 5 is connected to a respective one of the row lines ROW1 to ROWn in an array of picture elements (or pixels). The first to fourth clock signals C1 to C4 of the 4 phase clock signal lines CLK1 to CLK4 each has a period corresponding to 4 horizontal scanning intervals and a phase shifted sequentially by one horizontal scanning interval. The second to nth stages $22_2$ to $22_n$ each receive 3 clock signals having the phases delayed by one horizontal scanning interval, respectively, relative to the 3 clock signals applied to the previous stage $22_1$ to $22_{n-1}$. For example, if the first stage $22_1$ receives the first, third and fourth clock signals C1, C3 and C4, the second stage $22_2$ inputs the second, fourth and first clock signals C2, C4 and C1 having the phases delayed from the first, third and fourth clock signals C1, C3 and C4, respectively, by one horizontal scanning interval. Similarly, each third to nth stages $22_3$ to $22_n$ receives 3 clock signals, respectively, having the phases delayed from the 3 clock signals, respectively, applied to the previous stage $22_2$ to $22_{n-1}$ by one horizontal scanning interval. When a start pulse SP is applied to the first stage $22_1$ the first to nth stages shift the start pulse SP to enable sequentially the output lines $24_1$ to $24_n$ of the first to nth stages $22_1$ to $22_n$. The output signals $g_1$ to $g_{n-1}$ of the first to (n−1)th stages $22_1$ to $22_{n-1}$ are then applied to next stages $22_2$ to $22_n$ as a start pulse SP. To this end, the n row lines ROW1 to ROWn connected to the output lines $24$ to $24_n$ of the n stages $22_1$ to $22_n$ are sequentially driven. The n stages $22_1$ to $22_n$, are driven in the same manner. For the convenience of description, an arbitrary stage $22_i$ receiving the first, third and fourth clock signals C1, C3 and C4 will be explained in detail, as an example of the n stages $22_1$ to $22_n$.

Figure 6:
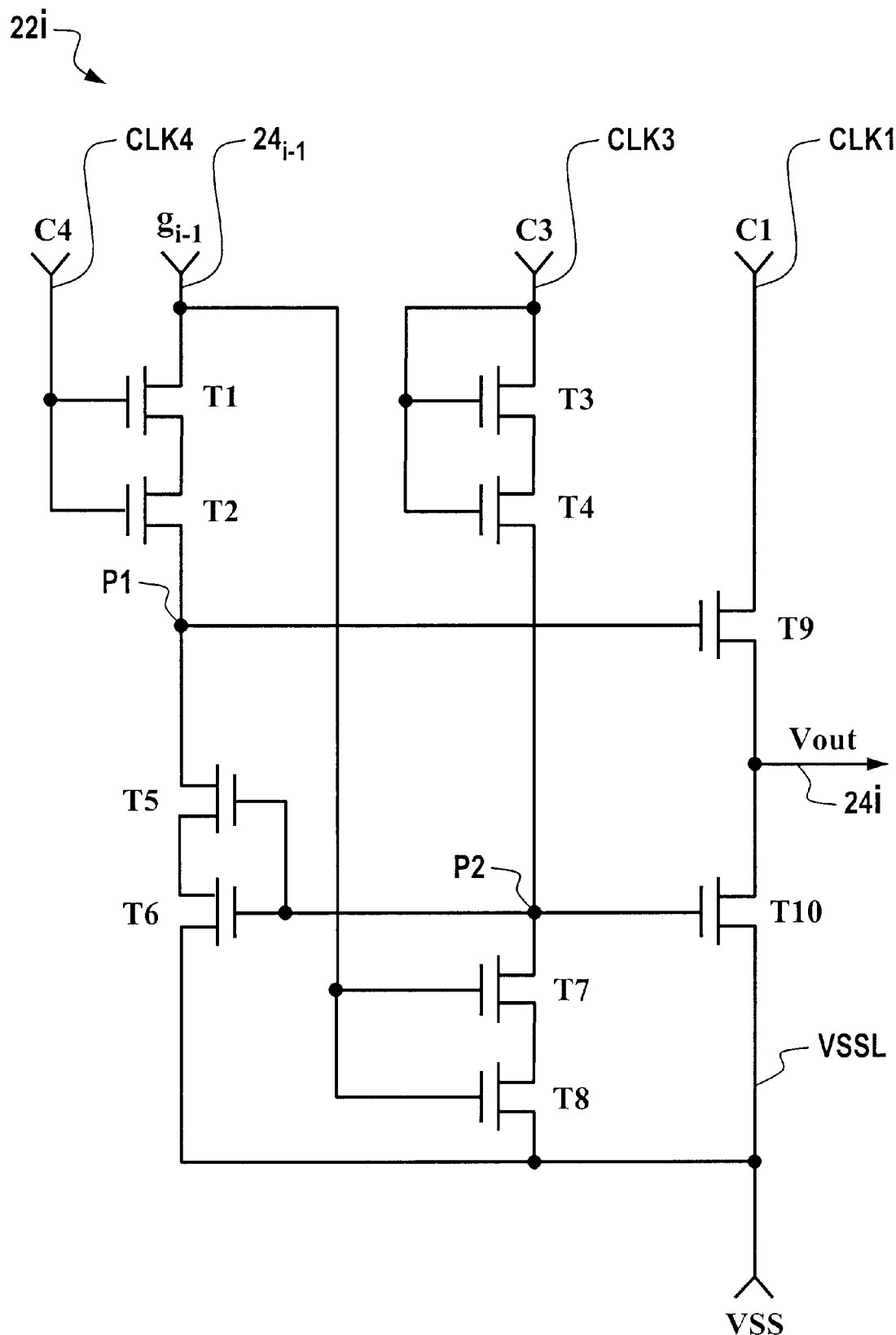
FIG. 6 is a circuit diagram showing in detail an embodiment of an arbitrary stage in FIG. 5.

FIG. 6 depicts in detail the configuration of an arbitrary stage $22_1$ included in the shift register shown in FIG. 5. The arbitrary stage $22_i$ of FIG. 6 includes first and second NMOS transistors T1 and T2 connected between an output line $24_{i-1}$ of a previous stage $22_{i-1}$ and a first node P1, third and fourth NMOS transistors T3 and T4 connected between a third clock signal line CLK3 and a second node P2, fifth and sixth NMOS transistors T5 and T6 connected between the first node P1 and a ground voltage line VSSL, and seventh and eighth NMOS transistors T7 and T8 connected between the second node P2 and the ground voltage line VSSL. The gates of the first and second NMOS transistors T1 and T2 are commonly connected to a fourth clock signal line CLK4. The gates of the third and fourth NMOS transistors T3 and T4 are commonly connected to the third clock signal line CLK3. The fifth and sixth NMOS transistors T5 and T6 have gate electrodes connected commonly to the second node P2, respectively. The seventh and eighth NMOS transistors T7 and T8 each has a gate electrode connected to the output line $24_{i-1}$ of the previous stage $22_{i-1}$. The arbitrary stage $22_i$ further comprises a ninth NMOS transistor T9 connected to a first clock signal line CLK1, the first node P1 and an output line $24_i$, and a tenth NMOS transistor T9 connected to the output line $24_i$, the second node P2 and the ground voltage line VSSL.

Figure 1:
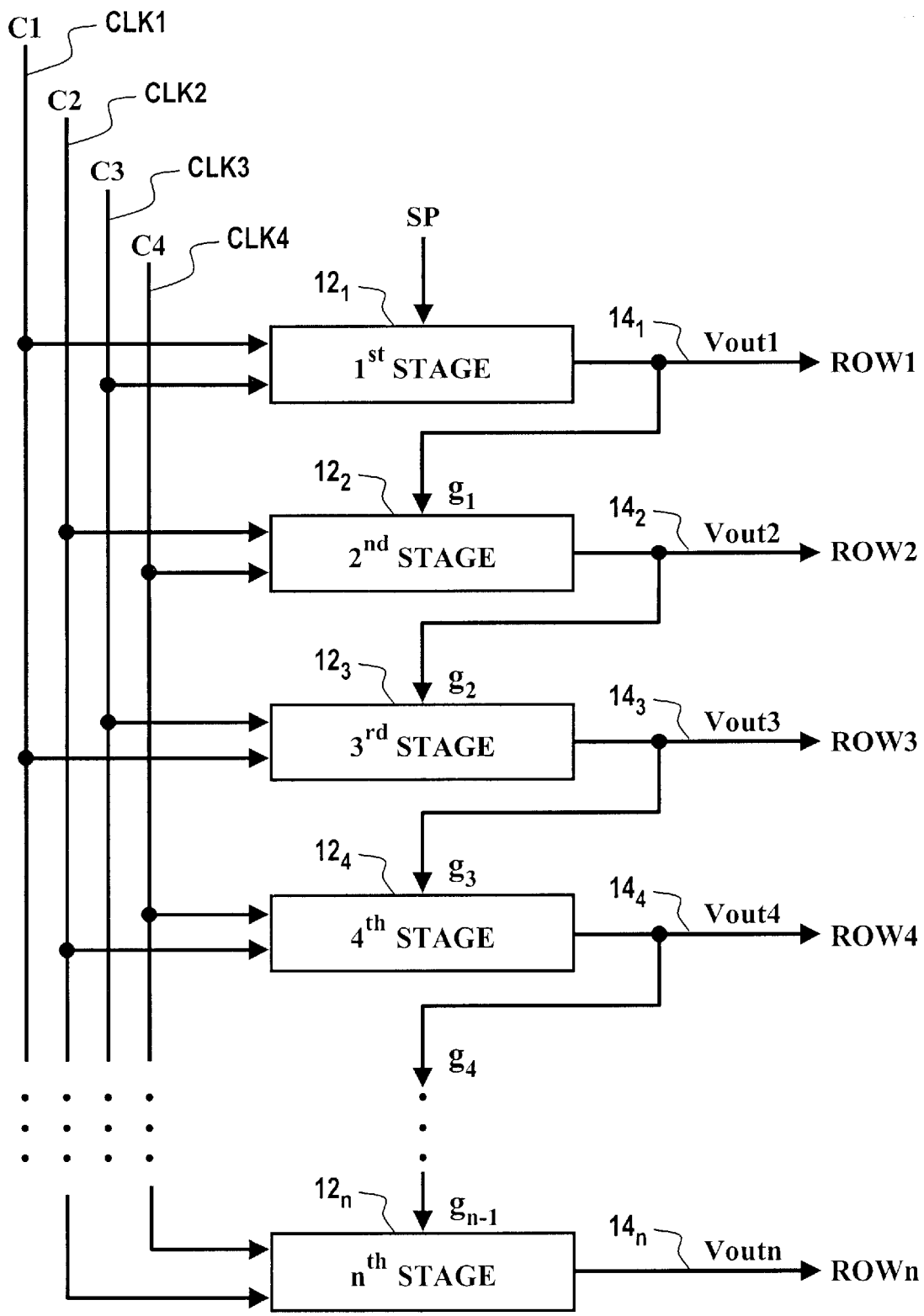
FIG. 1 is a schematic block diagram showing a conventional 4-phase shift register.
Figure 2:
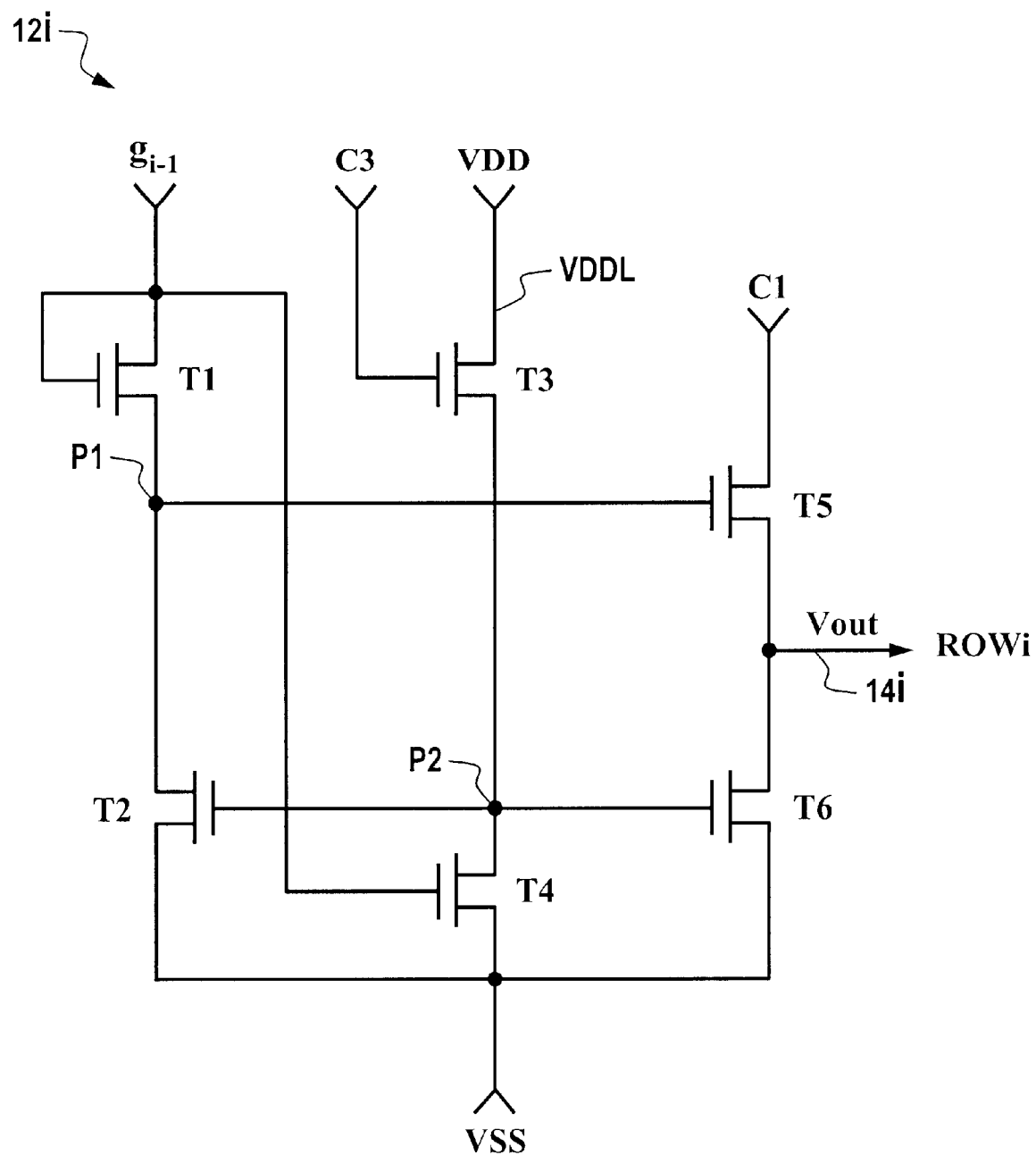
FIG. 2 is a detailed circuit diagram of an arbitrary stage shown in FIG. 1.
Figure 3:
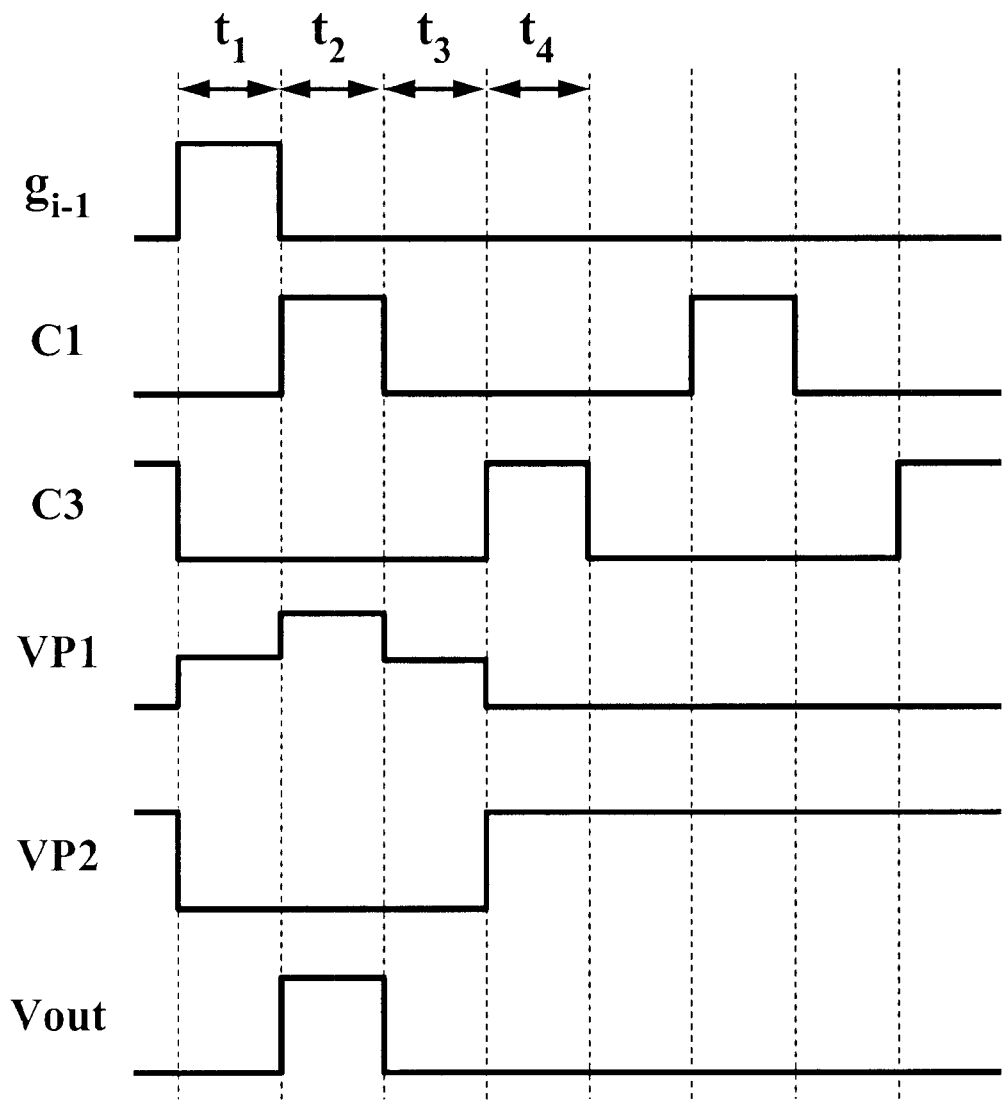
FIG. 3 is a waveform diagram of input and output signals in the arbitrary stage shown in FIG. 2.
Figure 4:
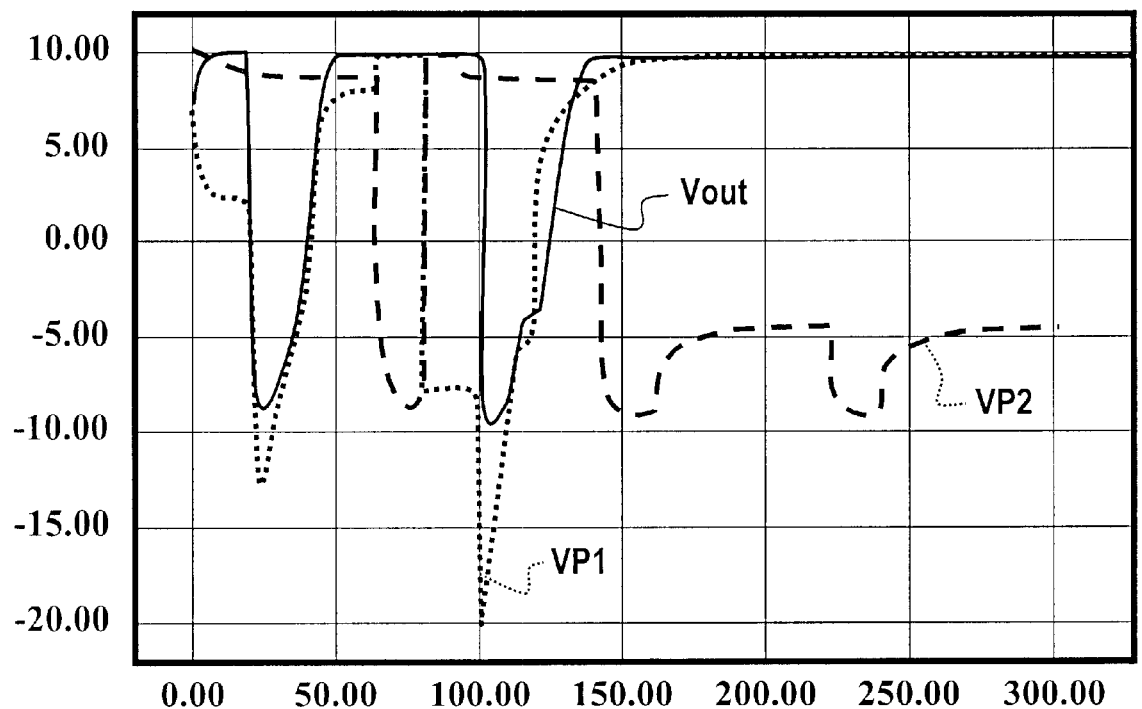
FIG. 4 is a waveform diagram of an output signal generated in each the stage and voltage signals on the first and second nodes in the simulation of the prior shift register.
Figure 7:
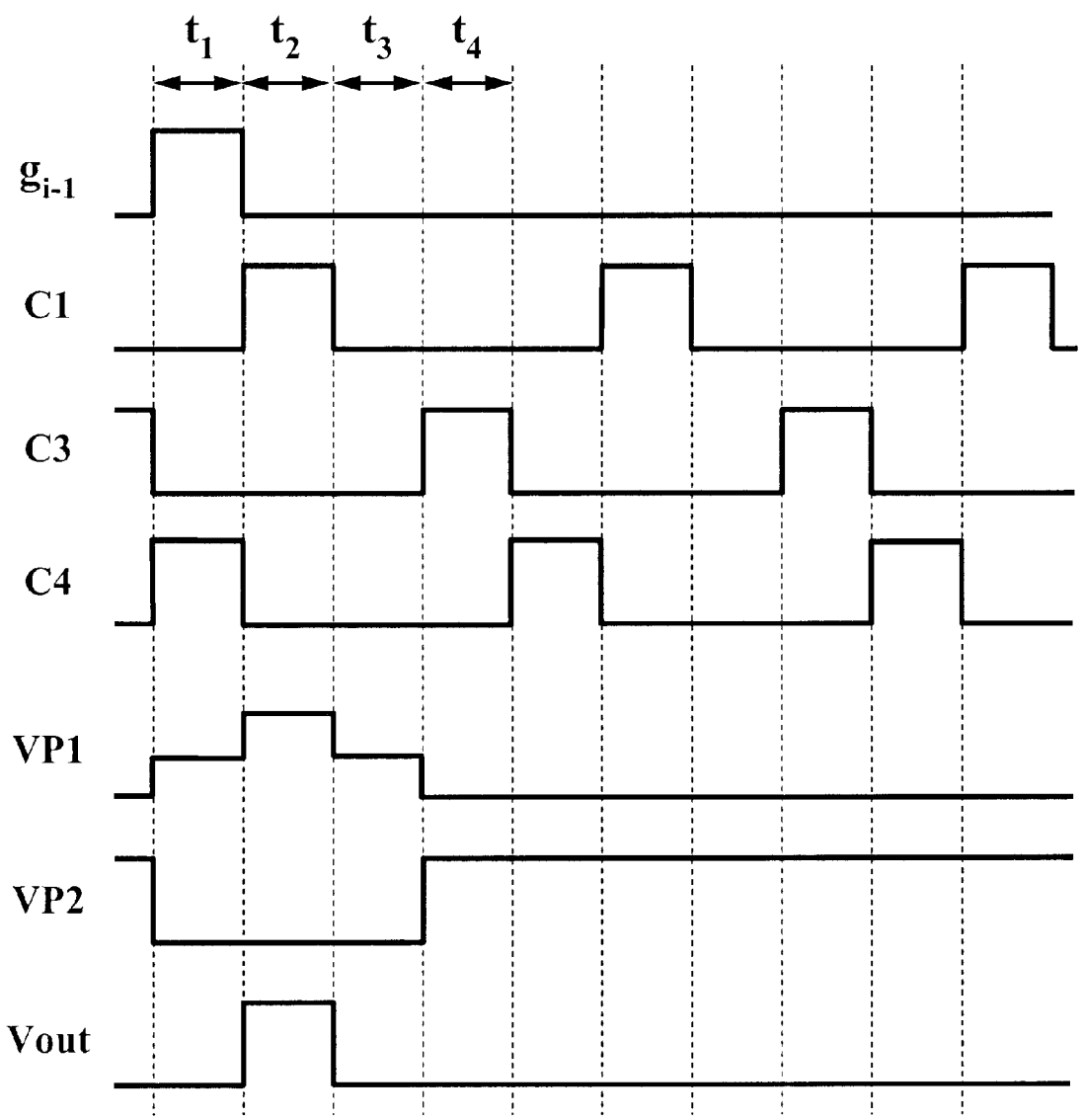
FIG. 7 is a waveform diagram of input and output signals in the arbitrary stage shown in FIG. 6.

The stage $22_i$ as shown in FIG. 6 has a range of operating voltage wider than that of the stage shown in FIG. 2 by decreasing the leakage current. The leakage current is reduced due to the NMOS transistors being connected to the first and second nodes P1 and P2 in a multi-gate structure. Also, the gate electrodes of the first and second NMOS transistors T1 and T2 are commonly connected to the output line $24_{i-1}$ of the previous stage $22_{i-1}$, thereby minimizing the decrease of potential charged on the first node P1 in the case that the output signal $g_{i-1}$ of the previous stage $22_{i-1}$ becomes too low. Further, in contrast to FIG. 2, since the gate electrodes of the third and fourth NMOS transistors T3 and T4 are commonly connected to the drain electrode of the third NMOS transistor T3, the high level voltage VDD from the arbitrary stage $22_{i-1}$. Such a stage $22_{i-1}$ as shown in FIG. 6 will be described with reference to waveform diagram of FIG. 7.

Firstly, during the interval of t1, the output signal $g_{i-1}$ having a high logic level is applied from the previous stage $22_{i-1}$ to the drain electrode of the first NMOS transistor T1 as the start pulse, and the fourth clock signal C4 on the fourth clock signal line CLK4 is supplied to the gate electrodes of the first and second NMOS transistor T1 and T2. Both the first clock signal C1 on the first clock signal line CLK1 and the third clock signal C3 on the third clock signal line CLK3 have the low logic level. In this case, the first and second NMOS transistors T1 and T2 are turned-on by the fourth clock signal C4 having the high logic level, and the seventh and eighth NMOS transistors T7 and T8 depending on the output signal $g_{i-1}$ of the previous stage $22_{i-1}$ are also turned-on. To this end, the first node P1 charges a voltage applied from the output line $24_{i-1}$ of the previous stage $22_{i-1}$ through the first and second NMOS transistors T9 and T2 to have the high logic level, thereby turning-on the ninth NMOS transistor T9. At this time, the output voltage signal Vout on the output line $24_i$ goes to the low logic level because the first clock signal C1 applied to the drain electrode of the ninth NMOS transistor T9 has the low logic level. Next, at the interval of t2, the output signal $g_{i-1}$ of the previous stage $22_{i-1}$ and the fourth clock signal C4 are inverted to the low logic level, while the first clock signal C1 changes to the high logic level. The first clock signal C1 having the high logic level is applied to the output line $24_i$ through the ninth NMOS transistor T9 which is turned-on by the high logic level on the first node P1, thereby producing the high logic level on the output line $24_i$. The voltage signal VP1 on the first node P1 is then bootstrapped to the high logic level by the coupling effect of a parasitic capacitor between the gate and source electrodes of the ninth NMOS transistor T9. If the first clock signal C1 changes to the low logic level during the interval of t3, the output voltage signal Vout on the output line $24_i$ has the low logic level since the ninth NMOS transistor T9 is turned on. Then, the voltage signal is dropped down to a mid level due to the first and second NMOS transistors T1 and T2 turning off. Finally, the third clock signal C3 having the high logic level is applied to the drain electrode of the third NMOS transistor T3 and the gate electrodes of the third and fourth NMOS transistors T3 and T4 during the interval of t4. The second node P2 is then charged by the third clock signal C3 having the high logic level from the third clock signal line CLK3 through the third and fourth NMOS transistors T3 and T4 to generate a voltage signal VP2 having the high logic level. The tenth NMOS transistor T10 is turned-on by the voltage signal VP2 of the high logic level from the second node P2 such that the output voltage signal Vout on the output line $24_i$ maintains the low logic level. The fifth and sixth NMOS transistors T5 and T6 are also turned-on by the voltage signal VP2 charged at the second node P2, thereby allowing the voltage signal VP1 on the first node P1 to be discharged to the ground voltage source VSS through the fifth and sixth NMOS transistors T5 and T6 and the ground voltage line VSSL.

As described above, each stage of the shift register circuit according to an embodiment of the present invention shifts the start pulse to its output line $24_i$ every horizontal scanning period. To this end, the n output lines $24_1$ to $24_n$ of the shift register circuit are sequentially enabled and furthermore the n row lines ROW1 to ROWn included in the array of the picture elements are sequentially driven.

Figure 8:
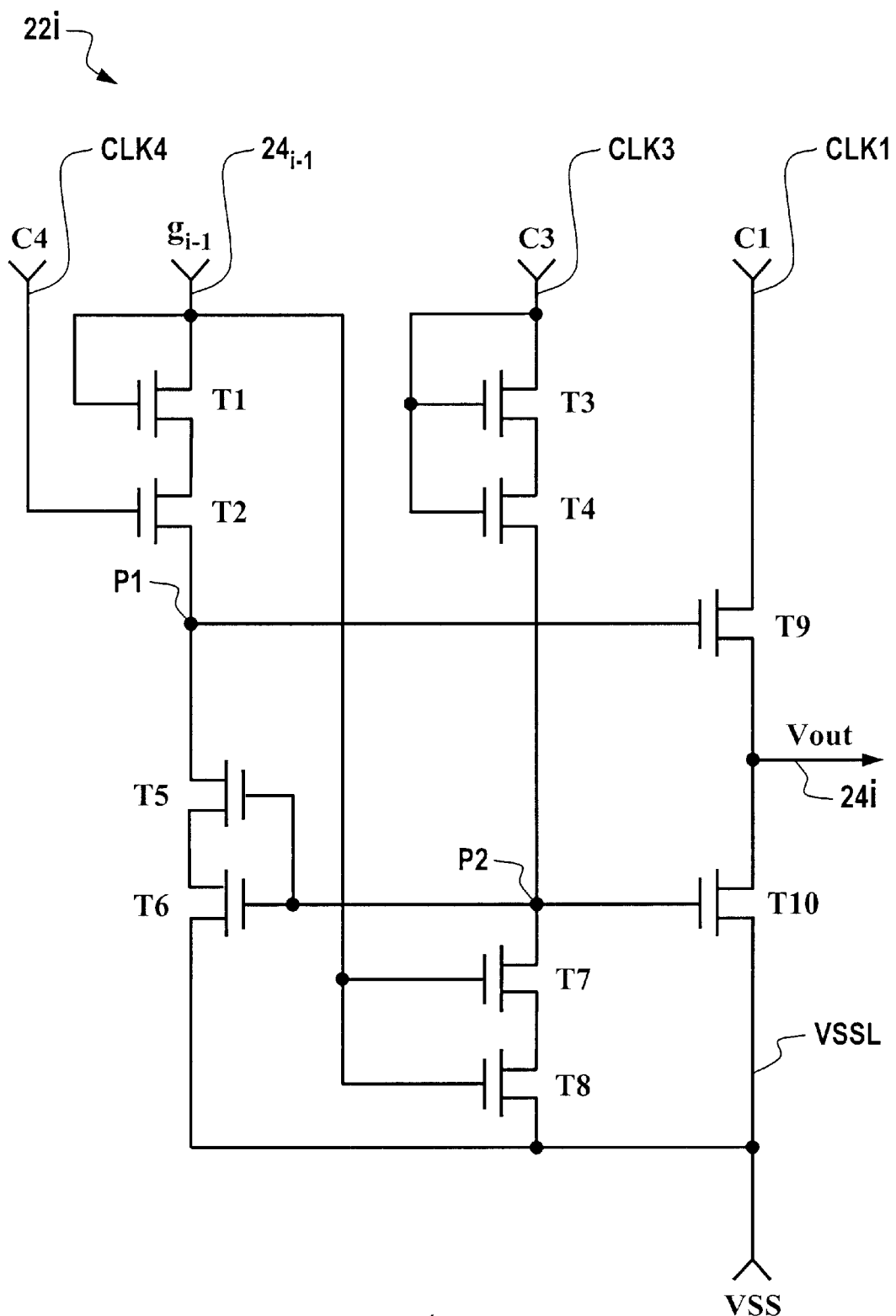
FIG. 8 is a circuit diagram showing in detail another embodiment of an arbitrary stage in FIG. 5.

FIG. 8 illustrates in detail a circuit configuration of another embodiment of the arbitrary stage $22_i$ shown in FIG. 5. The arbitrary stage $22_i$ of FIG. 8 has a similar circuit configuration as the arbitrary stage $22_i$ shown in FIG. 6. One difference is that while the gate electrode of the second NMOS transistor T2 remains connected to the fourth clock signal line CLK4, in FIG. 8 the drain and gate electrodes of the first NMOS transistor T1 are both commonly connected to the output line of the previous stage $22_{i-1}$.

Figure 9:
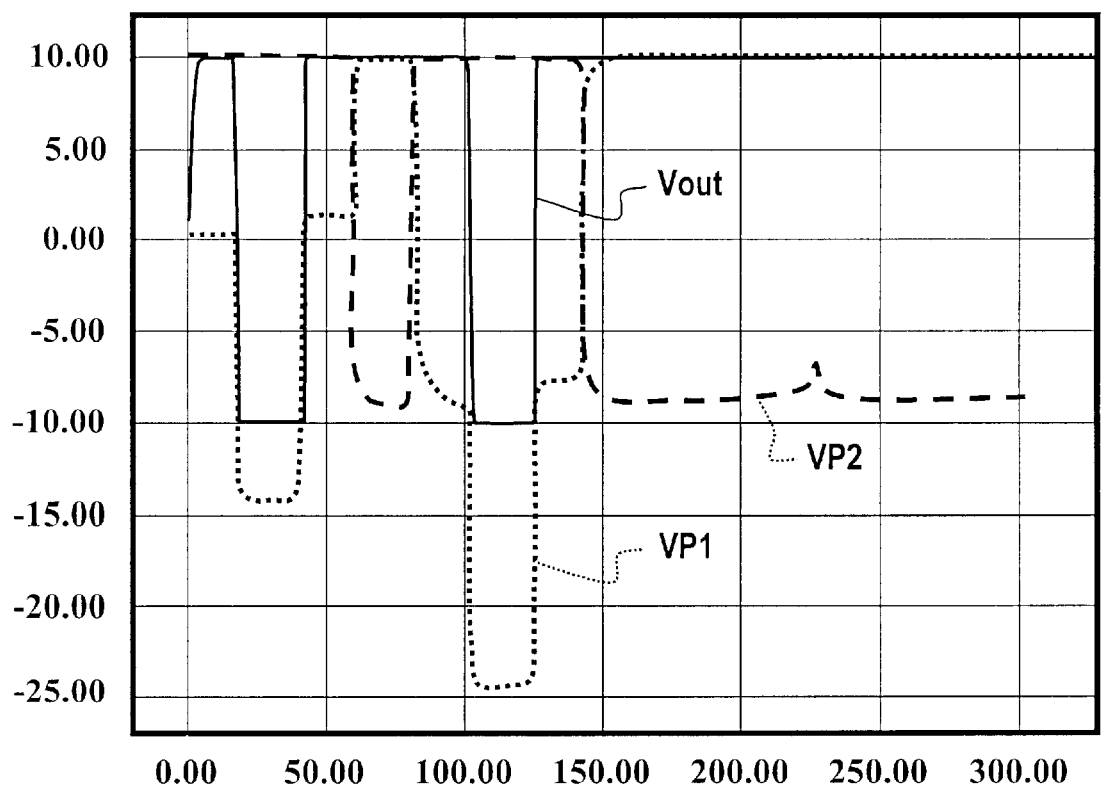
FIG. 9 is a waveform diagram of an output signal generated in each the stage and voltage signals on the first and second nodes in the simulation of the shift register circuit according to the present invention.

FIG. 9 shows a result of a simulation for the shift register circuit according to the present invention which includes NMOS transistors having a low absolute threshold voltage |Vth|. In FIG. 9, VP1 and VP2 are waveforms of the voltage signals on the first and second nodes P1 and P2, and Vout represents the output voltage signal on the output line $24_i$ of the present stage, i.e., the arbitrary stage. FIG. 9 shows that the voltage signals VP1 and VP2 on the first and second nodes P1 and P2 are stable. This results from the reduction of the currents leaked from the first and second nodes P1 and P2 by means of the NMOS transistors which are connected to the first and second nodes P1 and P2 in the multi-gate structure. To this end, the output voltage signal Vout charged on the output line $24_i$ becomes stable and the shift register circuit can be stably driven.

Figure 10:
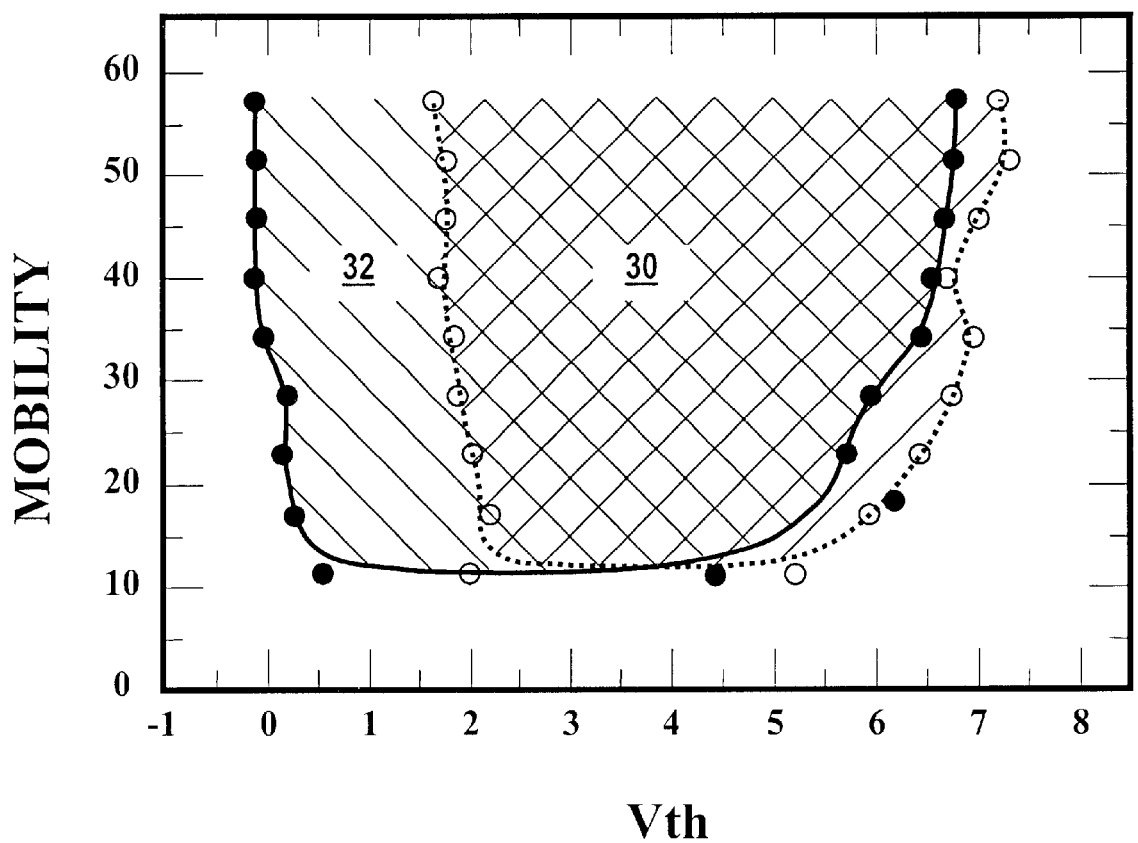
FIG. 10 explains the mobility of major carrier for the threshold voltage of transistor included in each the prior shift register circuit and the shift register circuit according to the present invention.

FIG. 10 is a graph comparing the mobility of major carrier for the threshold voltage of transistor in the prior shift circuit and that in the shift register circuit as disclosed herein. In FIG. 10, a first voltage range 30 represents the range of the operating voltage of the prior shift register circuit and a second voltage range 32 indicates the range of the operating voltage of the shift register circuit as disclosed herein. The first voltage range 30 occupies the region proceeding from the voltage level of about 2V to the voltage level of about 7V, while the second voltage range 32 occupies the region proceeding from the voltage level of about 0V to the voltage level of about 6.5V. Consequently, the shift register circuit as disclosed herein has a range of operating voltage wider than that of the prior shift register circuit by a region corresponding to about 1.5V.

As described above, in the shift register according to a preferred embodiment, NMOS transistors are connected to the first and second nodes P1 and P2 in the multi-gate structure so that the currents leaked from the first and second nodes P1 and P2 are reduced. To this end, the shift register is stably driven, and furthermore the range of operating voltage is wider. Also, in the shift register according to one preferred embodiment, the gate electrodes of first and second NMOS transistors T1 and T2 are connected to different clock signal lines, respectively, thereby minimizing any decrease in the potential charged on the first node P1 even if the output signal of the previous stage is reduced. Further, the shift register as disclosed herein can eliminate a line for supplying a high level voltage.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A shift register circuit comprising a plurality of cascaded stages connected to a start pulse input line and driving sequentially a plurality of row lines, each of the stages having an input terminal, an output terminal, a low level voltage line and being connected to first to third clock signal lines, the input terminal receiving an output signal of a previous stage, and the output terminal being connected to a row line, each one of the stages comprising:

a pull-up transistor having a control electrode and a conduction path connected between the first clock signal line and the output terminal;

a pull-down transistor having a control electrode and a conduction path connected between the low level voltage line and the output terminal;

first and second transistors having conduction paths connected in series between the input terminal and the control electrode of the pull-up transistor, and each having a control electrode, connected commonly to the second clock signal line, the first and second transistors allowing a voltage to be charged on the control electrode of the pull-up transistor; and third and fourth transistors having conduction paths connected in series between the third clock signal line and the control electrode of the pull-down transistor and, each having a control electrode connected commonly to the third clock signal line, the third and fourth transistors allowing a voltage to be charged on the control electrode of the pull-down transistor.

2. The shift register of claim 1, wherein each one of the stages further includes:

fifth and sixth transistors having conduction paths connected in series between the control electrode of the pull-up transistor and the low level voltage line, and each having a control electrode connected commonly to the control electrode of the pull-down transistor, the fifth and sixth transistors allowing a voltage charged on the control electrode of the pull-up transistor to be discharged; and seventh and eighth transistors having conduction paths connected in series between the control electrode of the pull-down transistor and the input terminal, and each having a control electrode connected commonly to the input terminal, the seventh and eighth transistors allowing a voltage charged on the control electrode of the pull-up transistor to be discharged.

3. The shift register of claim 1, wherein the start pulse on the input terminal and a second clock signal on the second clock signal line are simultaneously enabled during a first period such that a high logic level is charged on the control electrode of the pull-up transistor in response to the start pulse on the input terminal and the second clock signal.

4. The shift register of claim 3, wherein a first clock signal on the first clock signal line is subsequently enabled during a second period such that the pull-up transistor connects the output terminal to a high logic level.

5. The shift register of claim 3, wherein the first clock signal on the first clock signal line is subsequently disabled during a third period such that the pull-up transistor connects the output terminal to a low logic level.

6. A shift register including a plurality of cascaded stages connected to a start pulse input line and driving sequentially a plurality of row lines, each of the stages having an input terminal, an output terminal, a low level voltage line and being connected to first to third clock signal lines, the input terminal receiving an output signal of a previous stage, the output terminal being connected to a row line, each one of the stages comprising:

a pull-up transistor having a control electrode and a conduction path connected between the first clock signal line and the output terminal;

a pull-down transistor having a control electrode and a conduction path connected between the low level voltage line and the output terminal;

first and second transistors having conduction paths connected in series between the input terminal and the control electrode of the pull-up transistor, and each having a control electrode, connected respectively to the input terminal and to the second clock signal line, the first and second transistors allowing a voltage to be charged on the control electrode of the pull-up transistor; and third and fourth transistors having conduction paths connected in series between the third clock signal line and the control electrode of the pull-down transistor, and each having a control electrode, connected commonly to the third clock signal line, the third and fourth transistors allowing a voltage to be charged on the control electrode of the pull-down transistor.

7. The shift register of claim 6, wherein each one of the stages further includes:

fifth and sixth transistors having conduction paths connected in series between the control electrode of the pull-up transistor and the low level voltage line, and each having a control electrode connected commonly to the control electrode of the pull-down transistor, the fifth and sixth transistors allowing a voltage charged on the control electrode of the pull-up transistor to be discharged; and seventh and eighth transistors having conduction paths connected in series between the control electrode of the pull-down transistor and the input terminal, and each having a control electrode connected commonly to the input terminal, the seventh and eighth transistors allowing a voltage charged on the control electrode of the pull-up transistor to be discharged.

8. The shift register of claim 6, wherein the start pulse on the input terminal and a second clock signal on the second clock signal line are simultaneously enabled during a first period such that a high logic level is charged on the control electrode of the pull-up transistor in response to the start pulse on the input terminal and the second clock signal.

9. The shift register of claim 8, wherein a first clock signal on the first clock signal line is subsequently enabled during a second period such that the pull-up transistor connects the output terminal to a high logic level.

10. The shift register of claim 9, wherein the first clock signal on the first clock signal line is subsequently disabled during a third period such that the pull-up transistor connects the output terminal to a low logic level.

11. In a shift register stage having a low level voltage line, an input terminal, and an output terminal, and being connected to first to third clock signal lines, a pull-up transistor being disposed between the output terminal and the first clock signal line, and a pull-down transistor being disposed between the output terminal and the low level voltage line, a method of delaying a start pulse receiving at the input terminal by a clock period to produce an output pulse at the output terminal, said method comprising:

provide during a first clock period a start pulse on the input terminal and a clock pulse of a second clock signal on the second clock signal line to turn on the pull-up transistor and connect the output terminal with the first clock signal line having a low logic level;

providing during a second clock period a clock pulse of a first clock signal on the first clock signal line such that the pull-up transistor connects the output terminal to a high logic level;

disabling the clock pulse of the first clock signal on the first clock signal line during a third clock period such that the pull-up transistor connects the output terminal to a low logic level.

12. The method of claim 11, further comprising:

providing during a fourth clock period a clock pulse of a third clock signal on the third clock signal line such that the pull-down transistor connects the output terminal to the low level voltage line.

13. The method of claim 11, further comprising:

disabling during the second clock period the start pulse on the input terminal and the clock pulse of the second clock signal on the second clock signal line.

* * * * *